United States Patent [19]

Patalong

[11] Patent Number: 4,466,010
[45] Date of Patent: Aug. 14, 1984

[54] THYRISTOR WITH ENHANCEMENT AND DEPLETION MODE FET CONTROL FOR IMPROVED SWITCH BEHAVIOR AND METHOD OF USING SAME

[75] Inventor: Hubert Patalong, Munich, Fed. Rep. of Germany

[73] Assignee: Siemens Aktiengesellschaft, Berlin and Munich, Fed. Rep. of Germany

[21] Appl. No.: 366,559

[22] Filed: Apr. 8, 1982

[30] Foreign Application Priority Data

May 8, 1981 [DE] Fed. Rep. of Germany ....... 3118293

[51] Int. Cl.³ ............................................ H01L 29/78
[52] U.S. Cl. .................... 357/38; 357/23 D; 357/42; 357/86; 307/252 A; 307/252 C
[58] Field of Search ................... 357/23 D, 38, 41, 86, 357/42; 307/252 A, 252 C

[56] References Cited

U.S. PATENT DOCUMENTS 3,891,866 6/1975 Okuhara et al. ................ 307/252 C
4,224,634 9/1980 Suedberg .............................. 357/38

Primary Examiner—Joseph E. Clawson, Jr.
Attorney, Agent, or Firm—Hill, Van Santen, Steadman & Simpson

[57] ABSTRACT

A thyristor with gate-controlled emitter short-circuits designed as MIS structures of which a first part is switched off only for the duration of the ignition operation to form stabilization short-circuits, and a second, larger part is switched on only during quenching operation to form quenching short-circuits. The number of quenching short-circuits is established so that the emitter short-circuits effective during the quenching take up between 10% up to 80% of that part of the cross-sectional surface of the thyristor taken up by the totality of the emitter regions.

2 Claims, 1 Drawing Figure

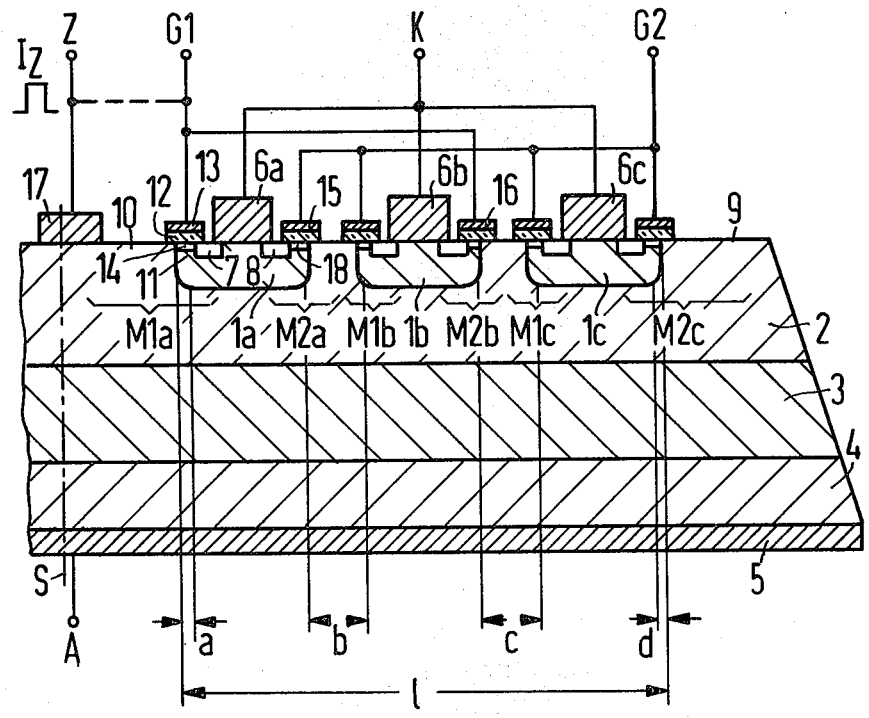

THYRISTOR WITH ENHANCEMENT AND DEPLETION MODE FET CONTROL FOR IMPROVED SWITCH BEHAVIOR AND METHOD OF USING SAME

BACKGROUND OF THE INVENTION

1. Field of the Invention

The present invention relates to thyristors and more particularly to thyristors with an ability to quench load current.

2. The Prior Art

In the past, thyristor designs have been proposed incorporating controllable emitter short circuits designed as MIS structures, either of the depletion type or the enhancement type. Before ignition of the thyristor, one MIS structure serves as a stabilization short circuit, and is switched off during triggering operation by means of a voltage pulse of a first polarity supplied to its gate, whereas another MIS structure serves as a quenching short circuit and is only switched on for the purpose of quenching the thyristor, by means of a voltage pulse of a second polarity supplied to its gate. Such MIS structures may be formed as a depletion type for one purpose and an enhancement type for the other, or alternatively, both MIS structures may be of the depletion or enhancement type. In this case the gate of one MIS structure is wired to a bias voltage which builds up a semiconductor channel below the gate or eliminates the semiconductor channel existing for a voltage-free condition of the gate; so that stabilization (or quenching) short circuits are formed. The other MIS structure is not wired to such a bias voltage so that it can perform a quenching (stabilization) short circuit function. U.S. Pat. No. 3,243,669 describes thyristors with controllable emitter short circuits designed as MIS structures, which are switched on for the purpose of a rapid quenching of the thyristors. The German Pat. No. 26 25 917 discloses a thyristor in which emitter short circuits are switched on during the occurrence of an ignition current pulse in order to prevent an ignition. Previous designs do not incorporate however a common disposition of at least one controllable emitter short circuit which serves only as a stabilization short circuit, and at least one other controllable emitter short circuit which serves only as a quenching circuit for a thyristor.

BRIEF DESCRIPTION OF THE INVENTION

A principal object of the present invention is to provide a thyristor which exhibits improved stability against unwanted ignition, and demonstrates a good shut off behaviour.

This object is achieved by providing MIS structures for stabilization quenching which form between 10 and 80 percent of the cross-sectional area of the load current conducting area of the thyristor.

This and other objects and advantages of the present invention may become manifest by an inspection of the following desription and the accompanying drawings.

BRIEF DESCRIPTION OF THE DRAWING

Reference will now be made to the accompanying drawing, which illustrates the cross-sectional view of an illustrative embodiment of the present invention.

DESCRIPTION OF THE PREFERRED EMBODIMENTS

The Figure shows a thyristor with a semiconductor body consisting of a doped semiconductor material, for example, silicon, and exhibiting four successive layers of alternating conductivity. A plurality of n-emitter regions 1a, 1b, 1c, form the n-emitter, a p-conductive layer 2 represents the p-base layer, an n-conductive layer 3 is referred to as the n-base, and a p-conductive layer 4 is referred to as the p-emitter. The p-emitter 4 is provided with an anode 6 consisting of conductive material, for example, aluminum, which has a terminal A, whereas the individual n-emitter regions 1a, 1b, 1c...are contacted by parts 6a, 6b, 6c...of a cathode which are connected to a common terminal K. The parts 6a, etc., of the cathode also consist of an electrically conductive material, for example, aluminum.

Two p-conductive regions 7 and 8 are inserted into the n-emitter region 1a, these p-conductive regions 7 and 8, extending up to the boundary surface 9 of the semiconductor body, and in contact with the part 6a of the cathode. Situated between the region 7 and a part 10 of the p-base layer 2, which lies directly next to the left edge of the n-emitter region 1a and extends up to the boundary surface 9, is an edge area 11 of the n-emitter region 1a which is covered by a thin insulating layer 12 applied to the boundary surface 9. A gate 13 consisting of electrically conductive material, for example, aluminum, is connected to a control terminal G1 and overlies the layer 12. The region 7 represents a first p-conductive semiconductor region forming an MIS structure M1a together with the part 10 as a second semiconductor region of the same conductivity, and the edge area 11 of the n-conductive semiconductor region lying therebetween. The gate 13 and the insulating layer 12 complete the MIS structure M1a which is of the depletion type so that, given a voltage-free gate 13, a p-conductive channel 14 is formed in the edge area 11 at the boundary surface 9, such p-conductive channel 14 connecting the part 10 over the region 7 to the part 6a of the cathode with a low-resistance. Thus, an emitter short-circuit 10, 14, 7 and 6a is formed between the parts 1a and 2.

The p-channel 14 consists either of an inversion channel which is built up by means of an electrical field existing at the boundary surface 9, or a doped channel region which has been generated directly a the boundary surface 9 by means of a flat p-doping. When a positive voltage is supplied to the control terminal G1, then the p-channel 14 is interrupted and the emitter short-circuit is removed.

A similarly constructed MIS structure M2a is situated at the right edge of the n-emitter region 1a. This structure, however, is of the enhancement type, and its gate 15 is connected to a control terminal G2. Without supplying a voltage to G2, no p-channel is formed in the structure M2a. Such a p-channel 15 exists only when a negative voltage is supplied to G2.

Further MIS structures M1b and M2b are provided at the edge relative to the n-emitter region 1b and, finally, corresponding MIS structures M1c and M2c are provided at the n-emitter region 1c. Of these, the structure M2b is connected to G1 by its gate 16, whereas the remaining structures are connected to G2 by their gates. The structure M2b is a structure of the depletion type, whereas the structures M2a, M1b, M1c and M2c are of the enhancement type.

A trigger electrode 17, which is connected to the terminal Z of an ignition circuit, is applied to the p-base layer 2.

During operation, the control terminals G1 and G2 are first disconnected from voltages in the blocked condition of the thyristor. In this way, the n-emitter region 1a is connected by a low-resistance path to the p-base layer 2, because of the engaged p-channel 14, just like the n-emitter region 1b over the channel of the MIS structure M2b. No low-resistance paths between the n-emitter regions and the p-base exist in the other MIS structures. Over their channels, the MIS structures M1a and M2b switch stabilization short-circuits on which avoid undesired ignitions which might otherwise be caused by the application of large or rapidly rising blocking voltage between A and K.

In order to ignite the thyristor, an ignition current pulse $I_z$ is supplied to Z. Simultaneously, G1 receives a positive pulse for the duration of the ignition operation, interrupting the p-channels of the structures M1a and M2b. Thus, the stabilization short-circuits are ineffective for the entire duration of the trigger operation. After the ignition has been accomplished, a load current of a load circuit connected at A and K flows over the thyristor which has been switched to its low-resistance state.

If, despite a voltage at A and K poled in the forward direction, the thyristor is to be quenched, then the emitter short-circuits over M2a, M1b, and M2c are switched on, by means of a negative voltage pulse applied to the terminal G2. This pulse renders all emitter short-circuits effective, so that the thyristor is quickly quenched. The emitter short-circuits over M2a, M1b, M1c and M2c are also referred to as quenching short-circuits.

A rapid quenching of the thyristor even for a large load currents, can be achieved when the emitter cross-sections which are effective during the quenching operation amount to approximately 10% up to 80% of the cross-sectional surface occupied by the totality of the n-emitter zones 1a through 1c. This is the case when the relationship applies to the paths a through d and 1:

$$(8/10)(a+b+c+d) = 1 (1/10)$$

In this expression, 1 represents the overall cross-sectional area occupied by the emitter regions, and a through d represent the areas occupied by all of the individual MIS structures.

The illustration in the drawing is not shown to scale, in the interest of clarity.

The surface proportion of the MIS structures M1a and M2b serving the purpose of stabilization expediently lie between 0.01% through 3% of the cross-sectional area of the thyristor employed by the n-emitter regions.

According to a further development of the invention MIS structures can be provided at the opposite boundary surface in addition to or instead of the MIS structures provided at the boundary surface 9, these structures at the opposite boundary surface, given a subdivision of the p-emitter 4 into individual emitter regions and given a corresponding subdivision of the anode 5, then representing p-emitter short-circuits.

It will be apparant to those skilled in the art that various modifications and additions may be made in the apparatus of the present invention without departing from the essential features of novelty thereof, which are intended to be defined and secured by the appended claims.

I claim as my invention:

1. A thyristor comprising a semiconductor body which exhibits an n-emitter contacted by a cathode electrode with an adjacent p-base layer and a p-emitter contacted by an anode electrode with an adjacent n-base layer, a plurality of controllable emitter short-circuits designed as MIS structures disposed at a boundary surface of the semiconductor body, said emitter short-circuits each including a first semiconductor region of a first conductivity type connected to one of said electrodes, a second semiconductor region of the first conductivity type connected to a base layer, and a third semiconductor area lying between said semiconductor regions and being covered by a gate electrically insulated from the semiconductor body, a first part of the MIS structures being of the depletion type and a second part of the MIS structures being of the enhancement type, a first common control terminal connected to the gates of the MIS structures of the one type, a second common control terminal connected to the gates of the MIS structures of the other type, one of said emitters including a plurality of emitter regions, and said first and second parts of the MIS structures together taking up between 10% and 80% of the total cross-sectional surface taken up by all of said emitter regions.

2. A method for operating a thyristor according to claim 1, including the step of supplying a first voltage pulse of a first polarity to the first common control terminal for extinguishing the emitter short-circuits of the MIS structure connected to said first control terminal during the trigger operation, and supplying a second voltage pulse of the opposite polarity to the second common control terminal for switching the emitter short-circuits of the MIS structures connected to said second contact terminal on during the quenching operation.

* * * * *